United States Patent
Luijten

(10) Patent No.: US 9,494,879 B2
(45) Date of Patent: Nov. 15, 2016

(54) CONTAMINATION TRAP FOR A LITHOGRAPHIC APPARATUS

(71) Applicant: ASML Netherlands B.V., Veldhoven (NL)

(72) Inventor: Carlo Cornelis Maria Luijten, Duizel (NL)

(73) Assignee: ASML Netherlands B.V., Veldhoven (NL)

( * ) Notice: Subject to any disclaimer, the term of this patent is extended or adjusted under 35 U.S.C. 154(b) by 71 days.

(21) Appl. No.: 14/395,981

(22) PCT Filed: Apr. 5, 2013

(86) PCT No.: PCT/EP2013/057169
§ 371 (c)(1),
(2) Date: Oct. 21, 2014

(87) PCT Pub. No.: WO2013/160083
PCT Pub. Date: Oct. 31, 2013

(65) Prior Publication Data
US 2015/0138519 A1 May 21, 2015

Related U.S. Application Data

(60) Provisional application No. 61/636,960, filed on Apr. 23, 2012.

(51) Int. Cl.
*G03B 27/52* (2006.01)
*G03B 27/72* (2006.01)
*G03F 7/20* (2006.01)
*H05G 2/00* (2006.01)

(52) U.S. Cl.
CPC ....... *G03F 7/70916* (2013.01); *G03F 7/70033* (2013.01); *G03F 7/70883* (2013.01); *H05G 2/008* (2013.01)

(58) Field of Classification Search
CPC ........... G03F 7/70033; G03F 7/70858; G03F 7/70883; G03F 7/70891; G03F 7/70908; G03F 7/70916; G03F 7/70925; G03F 7/70933; H05G 2/008; H01J 37/32798; H01J 37/328533; H01J 37/32871; H01J 37/32009; H01J 37/32522; H05H 1/24

USPC ............. 355/30, 52, 53, 55, 67–71, 77; 250/492.1, 492.2, 492.24, 493.1, 250/503.1, 504 R; 315/111.21, 111.71; 313/11–13, 15, 22, 35, 45, 46, 231.31
See application file for complete search history.

(56) References Cited

U.S. PATENT DOCUMENTS

| | | | |
|---|---|---|---|
| 2005/0199829 A1* | 9/2005 | Partlo | B82Y 10/00 250/504 R |
| 2006/0139604 A1 | 6/2006 | Wassink et al. | |

(Continued)

FOREIGN PATENT DOCUMENTS

WO   WO 2010/028899 A1   3/2010

OTHER PUBLICATIONS

International Search Report directed to related International Patent Application No. PCT/EP2013/057169, mailed Aug. 27, 2013; 5 pages.

(Continued)

*Primary Examiner* — Christina Riddle
(74) *Attorney, Agent, or Firm* — Sterne, Kessler, Goldstein & Fox P.L.L.C.

(57) ABSTRACT

Disclosed is a contamination trap arrangement (300) configured to trap debris particles that are generated with the formation of a plasma within a radiation source configured to generate extreme ultraviolet radiation. The contamination trap comprises a vane structure (310) for trapping the debris particles; a heating arrangement (330) for heating the vane structure, the heating arrangement being in thermal communication with the vane structure; a cooling arrangement (350) for transporting heat generated as a result of the plasma formation, away from the vane structure, and a gap (370) between the heating arrangement and the cooling arrangement. The cooling arrangement is in thermal communication with the vane structure via the heating arrangement and the gap and the contamination trap also comprises a heat transfer adjustment arrangement operable to adjust the heat transfer characteristics of a fluid inside of the gap by providing for controllable relative movement between the surfaces defining the gap.

13 Claims, 2 Drawing Sheets

(56) References Cited

U.S. PATENT DOCUMENTS

2006/0175558 A1* 8/2006 Bakker ............... G03F 7/70175
250/492.2
2007/0115443 A1 5/2007 Box et al.
2007/0146659 A1 6/2007 Klunder et al.
2011/0226745 A1 9/2011 Nagai et al.

OTHER PUBLICATIONS

International Preliminary Report on Patentability and Written Opinion of the International Searching Authority directed to related International Patent Application No. PCT/EP2013/057169, issued October 28, 2014; 7 pages.

* cited by examiner

CONTAMINATION TRAP FOR A LITHOGRAPHIC APPARATUS

CROSS-REFERENCE TO RELATED APPLICATIONS

This application claims the benefit of U.S. provisional application 61/636,960, which was filed on 23 Apr. 2012, and which is incorporated herein in its entirety by reference.

FIELD

The present invention relates to a contamination trap for a lithographic apparatus, and in particular a contamination trap for an EUV radiation source for lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured. A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$ by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

When using a plasma source, contamination particles are created as a by-product of the plasma generation. Generally, such contamination particles are undesired because they adhere for example to reflective surfaces of the lithographic apparatus. Build up of contamination particles on reflective surfaces of the lithographic apparatus (directly or via other non-reflecting surfaces) reduces the reflectivity of those surfaces, and consequently may reduce the achievable throughput of the lithographic apparatus.

SUMMARY

It is desirable to reduce the accumulation of contamination particles on reflective surfaces of the lithographic apparatus. The invention in a first aspect provides a contamination trap arrangement configured to trap debris particles that are generated with the formation of a plasma within a radiation source configured to generate extreme ultraviolet radiation, the contamination trap comprising; a plurality of vanes configured to trap said debris particles; a heating arrangement configured to heat said plurality of vanes, said heating arrangement being in thermal communication with said plurality of vanes; a cooling arrangement configured to transport heat generated as a result of said plasma formation, away from said plurality of vanes, and a gap between said heating arrangement and said cooling arrangement; wherein said cooling arrangement is in thermal communication with said plurality of vanes via said heating arrangement and said gap; and said contamination trap arrangement further comprises a heat transfer adjustment arrangement configured to adjust the heat transfer characteristics of a fluid inside of said gap by providing for controllable relative movement between the surfaces defining said gap.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which.

Figure 3:
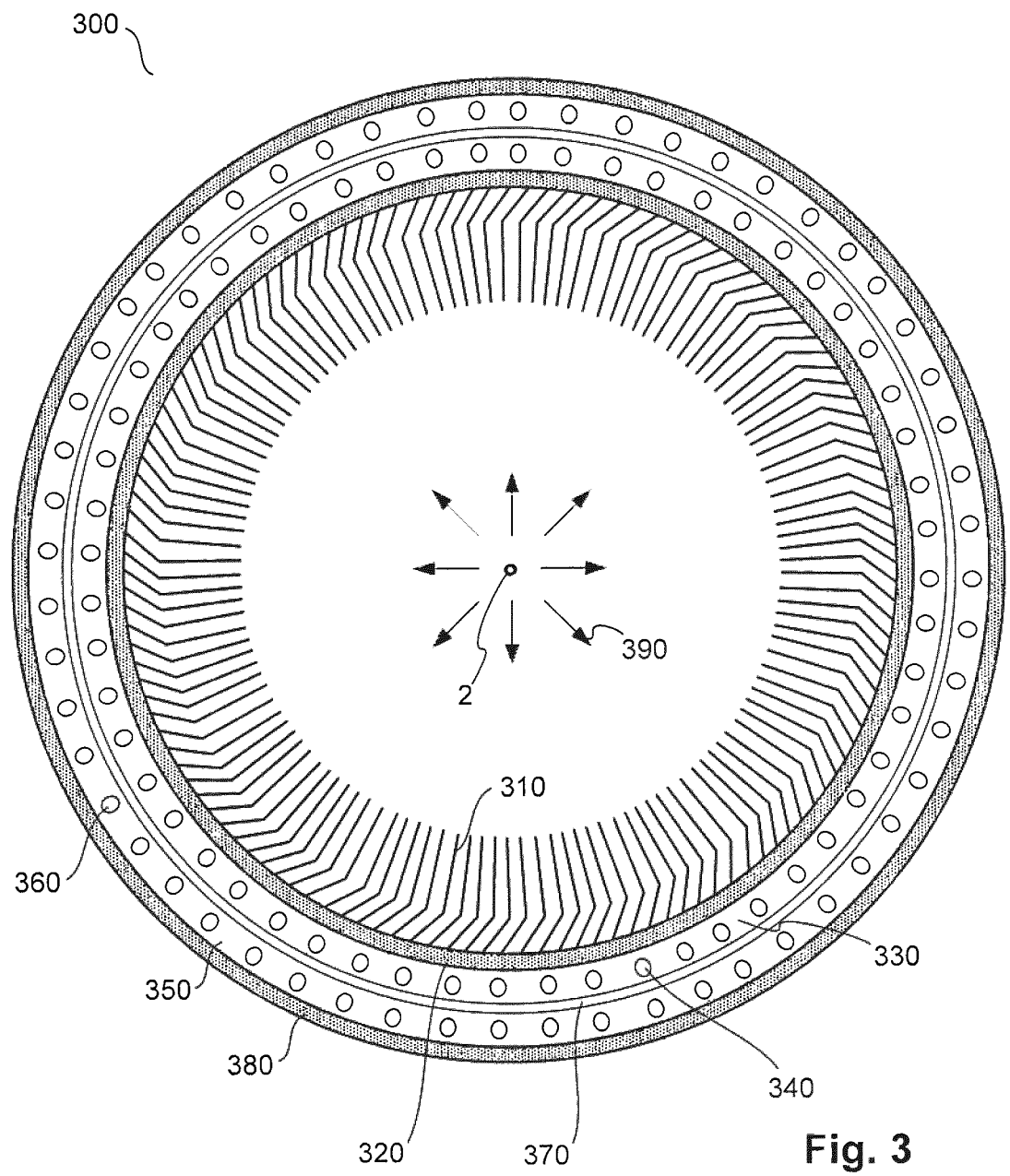

FIG. 3 schematically depicts a contamination trap according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF EXEMPLARY EMBODIMENTS

Figure 1:
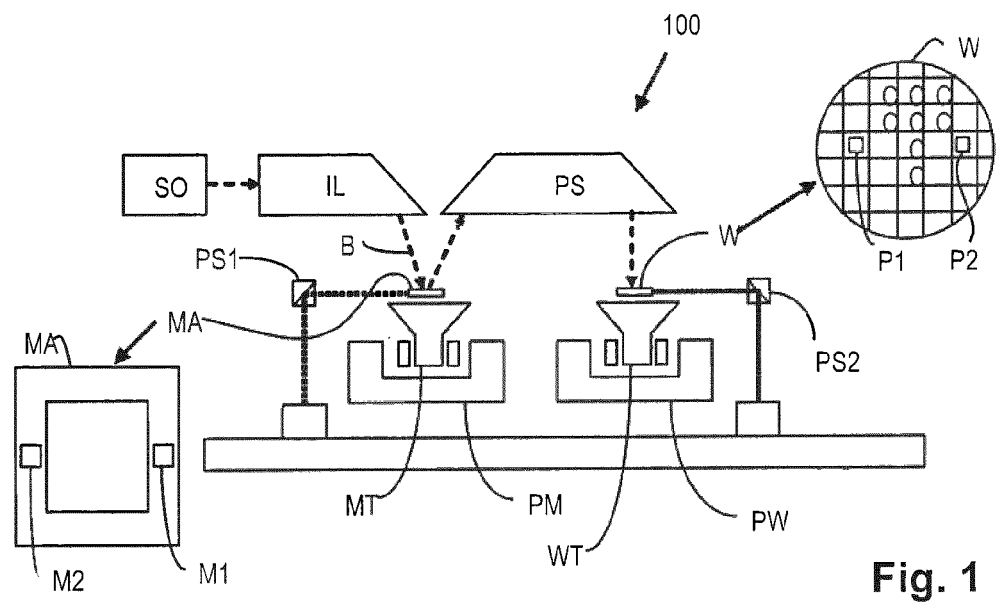
FIG. 1 depicts schematically a lithographic apparatus having reflective projection optics.

FIG. 1 schematically depicts a lithographic apparatus 100 including a source collector module SO according to one embodiment of the invention. The apparatus comprises:

- an illumination system (illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist-coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
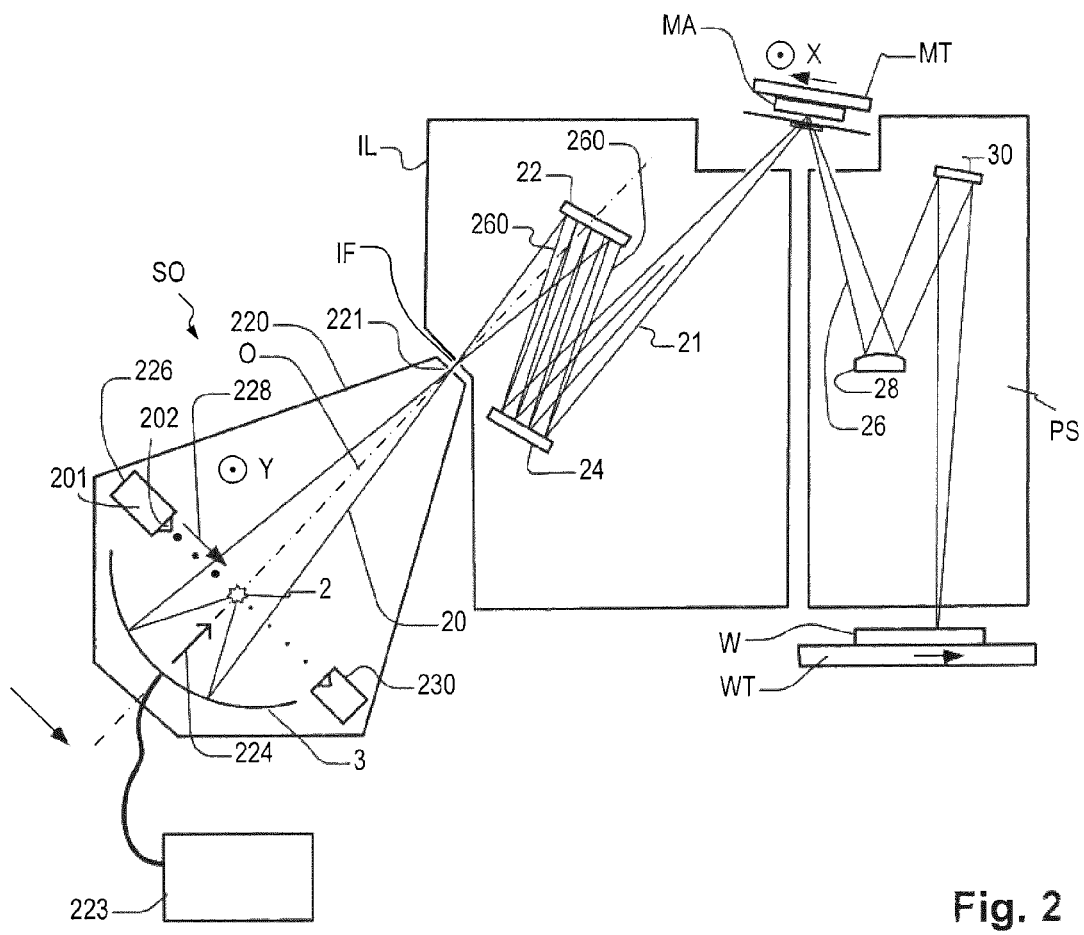
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. The systems IL and PS are likewise contained within vacuum environments of their own. An EUV radiation emitting plasma 2 may be formed by a laser produced LPP plasma source. The function of source collector module SO is to deliver EUV radiation beam 20 from the plasma 2 such that it is focused in a virtual source point. The virtual source point is commonly referred to as the intermediate focus (IF), and the source collector module is arranged such that the intermediate focus IF is located at or near an aperture 221 in the enclosing structure 220. The virtual source point IF is an image of the radiation emitting plasma 2.

From the aperture 221 at the intermediate focus IF, the radiation traverses the illumination system IL, which in this example includes a facetted field mirror device 22 and a facetted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA. Upon reflection of the beam 21 at the patterning device MA, held by the support structure (mask table) MT, a patterned beam 26 is formed and the patterned beam 26 is imaged by the projection system PS via reflective elements 28, 30 onto a substrate W held by the wafer stage or substrate table WT. To expose a target portion C on substrate W, pulses of radiation are generated on substrate table WT and masked table MT perform synchronized movements 266, 268 to scan the pattern on patterning device MA through the slit of illumination.

Each system IL and PS is arranged within its own vacuum or near-vacuum environment, defined by enclosing structures similar to enclosing structure 220. More elements than shown may generally be present in illumination system IL and projection system PS. Further, there may be more mirrors present than those shown in the Figures. For example there may be one to six additional reflective elements present in the illumination system IL and/or the projection system PS, besides those shown in FIG. 2.

Considering source collector module SO in more detail, laser energy source comprising laser 223 is arranged to deposit laser energy 224 into a fuel, such as xenon (Xe), tin (Sn) or lithium (Li), creating the highly ionized plasma 2 with electron temperatures of several 10's of eV. Higher energy EUV radiation may be generated with other fuel materials, for example Tb and Gd. The energetic radiation generated during de-excitation and recombination of these ions is emitted from the plasma, collected by a near-normal incidence collector 3 and focused on the aperture 221. The plasma 2 and the aperture 221 are located at first and second focal points of collector CO, respectively.

Although the collector 3 shown in FIG. 2 is a single curved mirror, the collector may take other forms. For example, the collector may be a Schwarzschild collector having two radiation collecting surfaces. In an embodiment, the collector may be a grazing incidence collector that comprises a plurality of substantially cylindrical reflectors nested within one another. The grazing incidence collector may be suited for use in a DPP source.

To deliver the fuel, which for example is liquid tin, a droplet generator 226 is arranged within the enclosure 220, arranged to fire a high frequency stream 228 of droplets towards the desired location of plasma 2. In operation, laser energy 224 is delivered in a synchronism with the operation of droplet generator 226, to deliver impulses of radiation to turn each fuel droplet into a plasma 2. The frequency of delivery of droplets may be several kilohertz, for example 50 kHz. In practice, laser energy 224 is delivered in at least two pulses: a pre pulse with limited energy is delivered to the droplet before it reaches the plasma location, in order to vaporize the fuel material into a small cloud, and then a main pulse of laser energy 224 is delivered to the cloud at the desired location, to generate the plasma 2. A trap 230 is provided across from said droplet generator 226, to capture fuel that is not, for whatever reason, turned into plasma.

In an alternative configuration (not illustrated) the EUV radiation may be generated by causing a partially ionized plasma of an electrical discharge to collapse onto an optical axis (e.g., via the pinch effect). This source may be referred to as a discharge produced plasma (DPP) source. Partial pressures of for example 10 Pa of Xe, Li, Sn vapor or any other suitable gas or vapor may be used to generate the EUV radiation emitting plasma.

As the skilled reader will know, reference axes X, Y and Z may be defined for measuring and describing the geometry and behavior of the apparatus, its various components, and the radiation beams 20, 21, 26. At each part of the apparatus, a local reference frame of X, Y and Z axes may be defined. The Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream 228, while the Y axis is orthogonal to that, pointing out of the page as indicated in FIG. 2. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

Numerous additional components critical to operation of the source collector module and the lithographic apparatus as a whole are present in a typical apparatus, though not illustrated here. These include arrangements for reducing or mitigating the effects of contamination within the enclosed vacuum, for example to prevent deposits of fuel material damaging or impairing the performance of collector 3 and other optics. Other features present but not described in detail are all the sensors, controllers and actuators involved in controlling of the various components and sub-systems of the lithographic apparatus.

When using a laser produced plasma (LPP) source or discharge produced plasma (DPP) source, contamination may be produced in the form of debris such as fast ions and/or neutral particles (for example Sn (tin)). Such debris may build up on the reflective surface(s) of the collector 3, causing the collector to lose reflectivity and thereby reducing the efficiency of the collector. Contamination by debris may also cause other reflective components of the lithographic apparatus (for example mirrors 22, 24, 28, 30 or patterning device MA) to lose reflectivity over time. The throughput of the lithographic apparatus is dependent upon the intensity of EUV radiation that is incident on a substrate being exposed. Any reduction of reflectivity that arises due to the build up of debris on the collector or other reflective surfaces of the lithographic apparatus may reduce the throughput of the lithographic apparatus.

FIG. 3 shows a contamination trap 300 that may be provided in a location outside of the EUV radiation cone formed by the collector 3. This structure consists of vanes 310 attached to the inside of vane body 320. Outside of this vane body 320 is a temperature control arrangement. This temperature control arrangement comprises a heating layer 330 and a cooling layer 350. The heating layer 330 and cooling layer 350 comprise respectively heating elements 340 or cooling pipes 360 embedded, in each case, within a layer of copper (or any suitable conducting material) to suppress thermal gradients. A gap 370 is provided between heating layer 330 and cooling layer 350, which may be configured to be filled by a fluid such as a gas. A heat transfer adjustment arrangement (not shown) is also provided, for adjustment of the heat transfer characteristics of the gas in the gap 370. Outside of the cooling layer 350 is an outer wall 380.

The vanes 310 are, in addition to trapping tin vapor and/or liquid tin remnants, designed to absorb (almost) the full heating power 390 of the source 2. Consequently, when the source is on, the vanes require cooling. This cooling is provided by cooling layer 350. When the source is off, the vanes should be maintained at a high temperature (for example 250-350° C.) in order to keep the tin in the liquid phase, thereby facilitating removal. This high temperature may be maintained by the heating layer 330. The heat transfer adjustment arrangement is operable to reduce the required heating power, by reducing heat transfer in gap 370, from the heating layer 330 to the cooling layer 350. Consequently, the heating layer 330 will require less power to heat vanes 310. Of course, when cooling is required the heat transfer characteristics of the gas in gap 370 are adjusted for maximal heat transfer coefficient.

It can be shown that the heat transfer coefficient (htc) over the gas in gap 370 needs to be accurately controlled in order to maintain the temperature of the vanes within desired boundaries (250-350° C.). By way of example: should the gas have a heat transfer coefficient (htc) of 30 W/m$^2$K, the vanes 310 would become too hot, while at 100 W/m$^2$K they would most probably stay too cold, causing the tin to solidify on the vanes 310. In addition, the heat radiating from the source onto the vanes varies over time and space. There is also likely to be spatial gradients over the vanes 310. Consequently, an accurate, and possibly real time, control of the htc over the gap 370 is desirable.

One possible solution would be for the heat transfer adjustment arrangement to be operable to adjust the pressure of the gas in gap 370. This would be achieved by increasing the gas pressure when cooling is required to obtain good thermal conduction, and reducing the gas pressure (evacuating) when heating is required, thereby isolating the cooling pipes from the heated vanes. However, both accuracy and time response of such an htc adjustment would be difficult to control with sufficient precision and/or responsiveness.

It is therefore proposed to vary the heat transfer coefficient (htc) of the gap between the vanes side and the cooling side of the tin vane catcher, by providing for controlled relative rotation of the apparatus on either side of gap 370. The speed of the relative motion affects the flow characteristics of the fluid inside the gap 370.

The Nusselt number Nu (non-dimensionalized htc) across the gap varies significantly with the flow speed of the medium inside the gap. For low (or zero) speed flow, the gap flow will be laminar and will result in a constant Nusselt number Nu. Consequently, heat transfer is predominantly via conduction, which is rather inefficient (Nu about 1 to 10). For faster flows, the flow in the gap becomes turbulent, and Nusselt number Nu becomes a function of the Reynolds number Re, which linearly depends on the rotational speed. In this way Nu may be in the region of 10-100. Consequently, the relative rotational speed of the apparatus can be used to accurately control, in real time, the heat transfer coefficient of the gap fluid, enabling a htc gain of between 1 and 2 orders of magnitude.

In a main embodiment, the heat transfer adjustment arrangement operates to control the relative rotational speed of the surfaces on either side of the gap 370. This means that the temperature of the vanes can be monitored (possibly at a number of points as there is likely to be considerable temperature differences over the vanes) and fed back so as to accurately control, in real time, heat transfer across the gap. This makes it possible to ensure that the vanes stay within a predetermined temperature range. At its simplest, the heat transfer adjustment arrangement may keep the relative movement very low (or zero) when the source is switched off, so as to prevent heating energy directly leaking to the cooling layer. On the other hand, with the source active and cooling required, the Nusselt number Nu (and therefore heat transfer coefficient) can be increased by increasing the relative rotational speed.

In one embodiment the whole contamination trap 300 structure inside of said gap 370 may be made to rotate relative to the outer mantle structure 350, 380. The advantage of this would be that the rotational movement can contribute to the desired liquid tin removal of the structure by the action of centrifugal forces on the liquid. However, other embodiments may have the outer mantle structure rotate, or even both structures rotate. In other embodiments only the layers (one or both) defining the gap 370 (that is the heating layer 330 and/or cooling layer 350) are made to rotate.

The contamination trap arrangement, and in particular the shape of the vanes, may take any number of different forms. Shown are kinked blades that are arranged with the symmetry axis along (or parallel with) the optical axis of the source, or parallel with gravity. An alternative arrangement has helical vanes with the helix's axis along (or parallel with) the optical axis of the source, or parallel with gravity. Other arrangements are possible.

While the concepts disclosed herein have been described specifically in combination with LPP sources, they are also applicable to other types of sources, such as DPP sources. Also the contamination trap may take other forms to that shown, such as comprising a plurality of tapering blocks instead of foils, or of foils in a different arrangement. In any case, the vanes may be arranged such that they are aligned towards the primary focus (plasma site), thereby minimizing back-reflection of secondary droplets. Vanes do not have to be placed exactly around the optical path, and the vane tips do not need to be near the EUV cone.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A contamination trap arrangement configured to trap debris particles that are generated with formation of a plasma within a radiation source configured to generate extreme ultraviolet radiation, the contamination trap comprising;
   a plurality of vanes configured to trap the debris particles;
   a heating arrangement configured to heat the plurality of vanes, the heating arrangement being in thermal communication with the plurality of vanes;
   a cooling arrangement configured to transport heat generated as a result of the plasma formation, away from the plurality of vanes; and
   a gap between the heating arrangement and the cooling arrangement,
   wherein the cooling arrangement is in thermal communication with the plurality of vanes via the heating arrangement and the gap.

2. The contamination trap arrangement of claim 1, wherein the plurality of vanes are attached to an inside of a substantially cylindrical structure, and the heating arrangement, the gap and the cooling arrangement are arranged concentrically around an outside of the substantially cylindrical structure.

3. The contamination trap arrangement of claim 2, wherein the heating arrangement comprises heating elements embedded within a wall of a conductive cylinder.

4. The contamination trap arrangement of claim 2, wherein the cooling arrangement comprises cooling elements embedded within a wall of a conductive cylinder.

5. The contamination trap arrangement of claim 2, wherein part of the contamination trap arrangement inside of the gap is arranged to be rotatable relative to part of the contamination trap arrangement outside of the gap to obtain a rotational movement.

6. The contamination trap arrangement of claim 1, wherein the contamination trap further comprises a heat transfer adjustment configured to adjust heat transfer characteristics of a fluid inside of the gap by providing for controllable relative movement between surfaces defining the gap.

7. The contamination trap of claim 6, wherein the heat transfer adjustment arrangement is configured to control the relative movement such that:
   when heating of the plurality of vanes is required, a speed of the relative movement is either zero or sufficiently slow as to prevent turbulent flow in the fluid inside of the gap; and
   when cooling of the plurality of vanes is required, a speed of the relative movement is sufficiently fast as to cause turbulent flow in the fluid inside of the gap.

8. The contamination trap of claim 6, wherein the heat transfer adjustment arrangement is configured to control a speed of the relative movement in real time so as to maintain a temperature of the plurality of vanes within predetermined limits.

9. The contamination trap arrangement of claim 6, wherein the controllable relative movement is rotational.

10. The contamination trap arrangement of claim 6, wherein the plurality of vanes are attached to an inside of a substantially cylindrical structure, and the heating arrangement, the gap and the cooling arrangement are arranged concentrically around an outside of the substantially cylindrical structure, and wherein the controllable relative movement is rotational.

11. A radiation source comprising:
a plasma formation site located at a position in which a fuel will be contacted by a beam of radiation to form a plasma; and
a contamination trap comprising;
   a plurality of vanes configured to trap debris particles;
   a heating arrangement configured to heat the plurality of vanes, the heating arrangement being in thermal communication with the plurality of vanes;
   a cooling arrangement configured to transport heat generated as a result of the plasma formation, away from the plurality of vanes; and
   a gap between the heating arrangement and the cooling arrangement,
   wherein the cooling arrangement is in thermal communication with the plurality of vanes via the heating arrangement and the gap.

12. A radiation source according to claim 11, wherein the contamination trap further comprises a heat transfer adjustment configured to adjust heat transfer characteristics of a fluid inside of the gap by providing for controllable relative movement between surfaces defining the gap.

13. A lithographic apparatus, comprising:
a radiation source comprising;
   a plurality of vanes configured to trap debris particles;
   a heating arrangement configured to heat the plurality of vanes, the heating arrangement being in thermal communication with the plurality of vanes;
   a cooling arrangement configured to transport heat generated as a result of the plasma formation, away from the plurality of vanes; and
   a gap between the heating arrangement and the cooling arrangement,
   wherein the cooling arrangement is in thermal communication with the plurality of vanes via the heating arrangement and the gap;
an illumination system configured to condition a radiation beam;
a support configured to support a patterning device, the patterning device being capable of imparting the radiation beam with a pattern in its cross-section to form a patterned radiation beam;
a substrate table configured to hold a substrate; and
a projection system configured to project the patterned radiation beam onto a target portion of the substrate.

* * * * *